United States Patent [19]

Ohashi

[11] 4,317,381
[45] Mar. 2, 1982

[54] PUSHBUTTON TUNER

[75] Inventor: Tamaki Ohashi, Tokyo, Japan

[73] Assignee: Nihon Technical Kabushiki Kaisha, Japan

[21] Appl. No.: 161,435

[22] Filed: Jun. 20, 1980

[30] Foreign Application Priority Data

Jun. 20, 1979 [JP] Japan .................................. 54-76725

[51] Int. Cl.$^3$ .............................................. H03J 5/12
[52] U.S. Cl. ..................................... 74/10.33; 334/7
[58] Field of Search ........................... 74/10.33; 334/7

[56] References Cited

U.S. PATENT DOCUMENTS

| | | | |
|---|---|---|---|
| 4,161,707 | 7/1979 | Kanai et al. ......................... | 74/10.33 |
| 4,187,729 | 2/1980 | Kanai et al. ......................... | 74/10.33 |
| 4,204,179 | 5/1980 | Kataoka et al. ....................... | 334/7 |

Primary Examiner—Allan D. Herrmann
Attorney, Agent, or Firm—Robert E. Burns; Emmanuel J. Lobato; Bruce L. Adams

[57] ABSTRACT

A pushbutton tuner including a support plate, tuning means mounted on the support so as to be movable to a position which corresponds to a tuning frequency to be established, and a plurality of presettable pushbutton actuators for selectively adjusting the tuning means to individual positions, each of the pushbutton actuators including a pushbutton which is movable between a front inoperative and a rear operative position relative to the support plate and which is normally urged to its inoperative position, a control plate pivotally mounted on the support plate and having lengthwise elongate slots formed in its opposite ends, the control plate assuming a position relative to the support plate which can be adjusted, a preset plate for releasably locking the control plate on the support plate, a first operating lever having its one end pivotally mounted on the pushbutton and carrying a pin on its other end which is fitted into one of the slots in the control plate, and a second operating lever having its one end pivotally mounted on the pushbutton and carrying a pin on its other end which is fitted in the other slot formed in the control plate, the tuning means including a pair of movable plates extending in a direction perpendicular to the direction of movement of the pushbutton, a link bar having its opposite ends connected to the movable plates so that a movement of one of the movable plate in one direction causes a movement of the other movable plate in the opposite direction, and cam edges formed on the pair of movable plates and having an equal angular orientation, said one movable plate moving in one direction upon abutment of one of the pins against the cam edges of said one movable plate as it moves through the elongate slot formed in the control plate, the movement of said one movable plate being transmitted through the link bar to cause the other movable plate to move in the opposite direction until the other pin abuts against the other cam edge, whereupon a further movement of said other movable plate is interrupted.

8 Claims, 8 Drawing Figures

PUSHBUTTON TUNER

FIELD OF THE INVENTION

The invention relates to a pushbutton tuner for use in a radio receiver, and more particularly, to a pushbutton tuner including a plurality of pushbuttons each of which is preset so as to be tuned to a different one of predetermined frequencies so that a subsequent actuation of one of the pushbuttons achieves a tuning to a desired frequency. The fundamental requirement upon such pushbutton tuner is the minimized thickness of the pushbutton tuner when assembled so that the space requirement within a radio receiver can be minimized and the achievement of an accurate tuning to a predetermined frequency whenever one of the pushbuttons is actuated to its operative position.

DESCRIPTION OF THE PRIOR ART

A pushbutton tuner having a reduced overall thickness is disclosed in U.S. Pat. No. 4,099,421 issued July 11, 1978 to the common assignee with the present application or U.S. Pat. No. 4,030,052 issued June 4, 1977 to Fernand F. Pelletier, for example. In these pushbutton tuners, a plurality of slides in the form of flat plates having pushbuttons secured to their one end are disposed on a baseplate so as to be independently movable between inoperative and operative positions. A control member is pivotally mounted on each slide, and causes a tuning member which is movable in a direction perpendicular to the direction of movement of the slide to move through a given travel whenever the associated slide is moved to its operative position. The movement of the tuning member acts on an armature telescoped into a tuning coil of the tuner, thus achieving a tuning to a desired frequency. To realize a tuning to a particular frequency, the control member is associated with a locking member which is supported on the slide and having its one end operable to lock the control member in place so that the latter may be controllably positioned relative to the associated slide. When presetting the control member to a desired frequency, the control member must be unlocked from the locking member. At this end, the slide is moved to a preset position which is offset from the inoperative position in a direction opposite from the operative position, and a preset member which is provided on the slide unlocks the control member from the locking plate. The tuning member is formed with a plurality of notches, one for each of the control members, against which part of the control member associated with each slide bears. Each of these notches is provided with either a single rectilinear bevelled surface or a pyramidal surface including a pair of rectilinear bevelled surfaces. When the control member bears against the notch, and is urged to move along the bevelled surface, the tuning member is caused to move in a direction perpendicular to the force applied to the control member in response to a component force thereof until the movement is constrained by the apex of the bevelled surface.

In a conventional pushbutton tuner of this type, the slides, the control members, the tuning member, the locking members and the preset members are formed as flat metal plates, which are disposed in face-to-face overlapping relationship in an attempt to reduce the overall thickness. However, since the slides carry the control members, locking members and preset members thereon, there results a disadvantage that the resulting structure of the parts which move in response to the operation of a pushbutton is complex. Since a slide having a relatively large area is moved from its inoperative to its operative position, there must be provided a space rearwardly of each pushbutton actuator which permits the rearward movement of the slide.

In a conventional pushbutton tuner of the type described, each slide is slidably supported in a slot formed in the baseplate or support plate. The slot is sized to be greater than the outer dimension of the slide in order to reduce the frictional resistance which the slide experiences. However a clearance formed between the slot and the slide causes a rattling in the movement of the slide which results in an error in the accuracy of tuning achieved by the tuning member. To eliminate the tuning error due to the rattling, the present applicant has proposed in a co-pending U.S. patent application Ser. No. 140,445 filed Apr. 17, 1980, a pushbutton tuner in which the tuning member is formed by a pair of movable plates which are movable in opposite directions and which are connected together by a link assembly and in which the control member is provided with a pair of upright pins which are engageable with notches formed in the respective movable plates. In this pushbutton tuner, when one of the upright pins on the control member bears against a notch in one of the movable plates to cause it to move in one direction, the link assembly causes the other movable plate to move in the opposite direction until the other upright pin bears against a notch formed in the other movable plate, whereupon a further movement of the pair of movable plates is blocked. The position assumed by the movable plates when their further movement is blocked correspond to a desired preset frequency. Component forces are developed at the point of engagement between the pair of upright pins and the pair of movable plates in response to the force applied to the pushbutton, but act in the same direction so that the movable plates are locked relative to each other, removing any movement of the tuning member or the movable plates which results from any rattling in the movement of the slide. In this manner, an accurate tuning to a desired frequency is achieved. While the described arrangement has successfully removed the influence of the rattling, there remains the disadvantage that the structure comprising movable parts is complex and a space must be provided to allow the movement of the slides inasmuch as the control members, the tuning members and the like are placed on the slides as in the initially cited U.S. Patents.

SUMMARY OF THE INVENTION

It is an object of the invention to provide a pushbutton tuner which is simple in construction and permits a reduction in size which allowing the overall thickness to be reduced.

It is another object of the invention to provide a pushbutton tuner in which desired frequencies can be accurately established and in which an accurate tuning to a desired frequency, corresponding to one of the frequencies established, can be achieved in response to a subsequent operation of the pushbutton.

It is a further object of the invention to provide a pushbutton tuner which can be manufactured within commercially acceptable tolerances without causing a tuning error.

In accordance with the invention, there is provided a pushbutton tuner including a support, tuning means mounted on the support so as to be movable to a position which corresponds to a tuning frequency to be established, and a plurality of presettable pushbutton actuators for selectively adjusting the tuning means to individual positions, each of the pushbutton actuators including a pushbutton which is movable between a front inoperative and a rear operative position relative to the support and which is normally urged to its inoperative position, a control member pivotally mounted on the support and having lengthwise elongate slots formed in its opposite ends, the control member assuming a position relative to the support which can be adjusted, a preset member for releasably locking the control member on the support, a first operating lever having its one end pivotally mounted on the pushbutton and carrying a pin on its other end which is fitted into one of the slots in the control member, and a second operating lever having its one end pivotally mounted on the pushbutton and carrying a pin on its other end which is fitted in the other slot formed in the control member, the tuning means including a pair of movable members extending in a direction perpendicular to the direction of movement of the pushbutton, a link member having its opposite ends connected to the movable members so that a movement of one of the movable members in one direction causes a movement of the other movable member in the opposite direction, and means operative when the pushbutton is moved to its operative position to transmit a movement of the first or the second operating lever to one of the movable members to thereby cause that movable member to move in one direction, the movement of said one movable member in said one direction being terminated when the resulting movement of the other movable member in the opposite direction is constrained by the associated pin.

In a preferred embodiment of the invention, a hollow pushbutton is slidably mounted on one end of the baseplate which is located nearer the operator, and a preset plate is slidably inserted into the hollow interior of the pushbutton. The preset plate can be inserted between the baseplate and one end of a locking lever which is supported by the baseplate. The other end of the locking lever is disposed in overlying relationship with one end of a control plate which is pivotally mounted on the baseplate intermediate its length and which is locked in place by the other end of the locking lever whenever the preset plate is inserted between the baseplate and the one end of the locking lever. The control plate extends parallel to the direction of movement of the pushbutton, and its opposite ends are formed with slots which are elongate lengthwise thereof. Loosely fitted in these slots are pins carried by one end of a first and a second operating lever, both of which are pivotally mounted in the hollow interior of the pushbutton at their other end. The pair of movable plates extend and are movable in a direction perpendicular to the direction of movement of the pushbutton, and are connected together by a link bar for movement in opposite directions. Each of the movable plates is formed with a cam edge which is inclined in an identical direction and which is disposed in opposing relationship with one of the pins. When the pushbutton is moved to its operative position, one of the pins engages the cam edge of one of the movable plates to cause it move in one direction. The resulting movement is transmitted to the other movable plate through the link bar, whereby the other movable plate moves in the opposite direction from the first mentioned movable plate. As the other movable plate into engagement with the other pin, a further movement thereof is blocked, so that the first mentioned movable plate cannot be moved in response to any force of an increased magnitude applied to the pushbutton. The positions assumed by the movable plates when a further movement thereof is blocked correspond to a desired frequency established. The preset plate is formed with an elongate slot which defines the travel of the pushbutton and which has a length equal to the distance between the inoperative and the operative position of the pushbutton. An engaging pin which has its opposite ends fixedly mounted on the pushbutton is loosely fitted in the elongate slot, whereby it is only necessary to move the pair of operating levers during a normal channel selection. A tuning to a desired frequency can be accurately achieved with a reduced force applied to the pushbutton.

DESCRIPTION OF THE PREFERRED EMBODIMENTS

Several preferred embodiments of the invention will now be described with reference to the attached drawings, and it should be noted that corresponding parts are designated by reference characters throughout the drawings.

Figure 1:
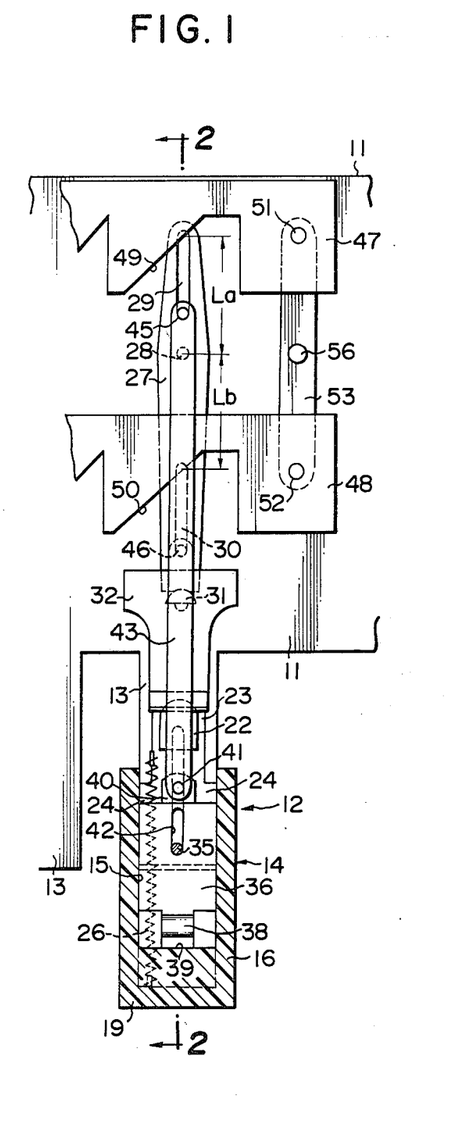
FIG. 1 is a plan view, partly cut away, of essential parts of a pushbutton tuner according to one embodiment of the invention.
Figure 2:
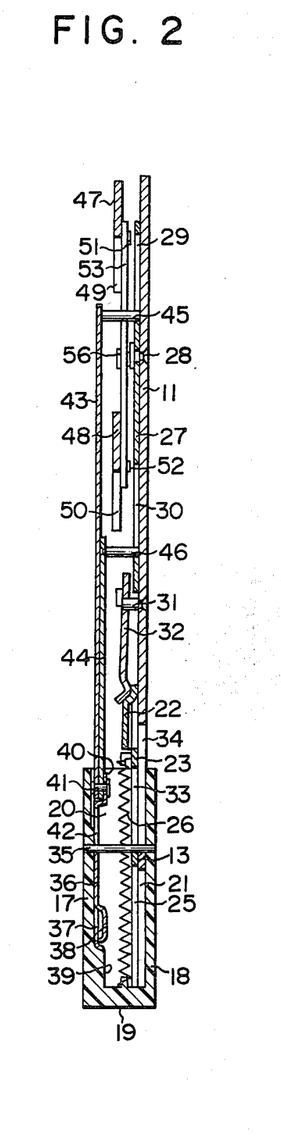
FIG. 2 is a longitudinal section taken along the line 2—2 shown in FIG. 1.

Referring to FIGS. 1 and 2, there is shown a pushbutton actuator generally designated by a reference numeral 12 which is supported to be slidable relative to a baseplate 11. While a single actuator is shown in FIG. 1, it should be understood that a plurality of actuators having the same construction are provided.

The pushbutton actuator 12 includes a pushbutton 14 which is supported by a forward extension 13 of the baseplate 11 so as to be slidable in the fore-and-aft direction. In the description to follow, the term "front end" or "front" or "forward" refers to the side located nearer the operator, or the lower side, as viewed in FIG. 1 while the term "rear end" or "rear" refers to the opposite side, or the upper side, as viewed in FIG. 1. The pushbutton 14 includes a left- and a right-hand sidewall 15, 16, a top wall 17, a bottom wall 18 and a front wall 19, whereby a hollow interior 20 is defined by these walls which is open at its rear end. A pair of first guide grooves 21 are formed in the internal surface of the both lateral sidewalls 15, 16, and slidably receive the opposite lateral edges of the extension 13. A preset plate 23 carrying a wedge portion 22 at its rear end is slidably mounted on the extension 13. Specifically, the both lateral edges 24 at the front end of the preset plate 23 are slidably received in a pair of second guide grooves 25 which are formed in the internal surface of the sidewalls 15, 16 of the pushbutton 14 at a location above the first guide grooves 21. The preset plate 23 is engaged by one end of a spring 26, the other end of which is anchored to the internal surface of the front wall 19 after extending through the hollow interior 20 of the pushbutton 14. As a result of the bias produced by the spring 26, the pushbutton 14 normally assumes its inoperative or front position. A control plate 27 which is elongate in the fore-and-aft direction is pivotally mounted on a pin 28 which is secured to the baseplate 11, in alignment with the extension 13. Both the front and the rear end of the control plate 27 are formed with slots 29, 30 which are elongate lengthwise thereof. As will be seen, the control plate 27 is angularly movable about the pin 28 relative to the baseplate 11, but can be locked in place by a plate locking lever 32 which is mounted on a pin 31 secured to the baseplate 11. The locking of the control plate 27 by the locking lever 32 takes place by moving the preset plate 23 rearwardly with its wedge portion 22 inserted between the baseplate 11 and the rear end of the locking lever 32 so that the rear end of the latter fixed the front end of the control plate 27. In its front end, the preset plate 23 is centrally formed with a lengthwise elongate slot 33 having a length which is at least equal to the distance between the inoperative and the operative position of the pushbutton 14. The extension 13 is formed with an elongate slot 34 which is aligned with the slot 33 and which has a greater length than the latter. The length of the slot 34 is at least equal to the distance between the reset position, offset forwardly of the inoperative position, and the operative position of the pushbutton 14. An engaging pin 35 is fitted into the slots 33, 34, and has its one end secured to the top wall 17 and its other end secured to the bottom wall 18 of the pushbutton 14. As a consequence, when the pushbutton 14 is pulled forward to its reset position, the engaging pin 35 engages the front end of the slot 33, drawing the preset plate 23 forwardly therewith and moving the wedge portion 22 thereof away from the plate locking lever 32. This unlocks the control plate 27.

In the upper portion, the both side walls 15, 16 of the pushbutton 14 are formed with guide grooves 37 which slidably support the both lateral edges of a sliding plate 36, which is formed of a resilient metal plate and which is formed with a folded piece 37 of a narrower width than the sliding plate 36 extending from the central front end thereof. The folded piece 37 rides up an inclined step 38 formed on the rear surface of the top wall 27 at the front end thereof, whereby the sliding plate 36 is fixed in position. The rear end of the sliding plate 36 is formed with a tongue 40 of a width less than that of the sliding plate 36, and a pivot pin 41 is fixedly mounted on the tongue. Intermediate the folded piece 37 and the tongue 40, the sliding plate 36 is formed with a lengthwise elongate slot 42 through which the engaging pin 35 extends. Pivotally mounted on the pivot pin 41 are one end of a first and a second operating lever 43, 44 each carrying a downwardly depending pin 45, 46 on its free end. The lower end of the pin 45 is loosely fitted in the elongate slot 29 formed in the control plate 27 while the lower end of the pin 46 is loosely fitted in the elongate slot 30 formed in the control plate 27.

A pair of movable plates 47, 48 are disposed in a common plane and in parallel relationship with each other so as to be movable in a direction perpendicular to the direction of movement of the pushbutton 14. These movable plates move in a direction perpendicular to the direction of movement of the operating levers 43, 43 as they slide rearwardly in response to the actuation of the pushbutton 14 to its operative position or to its rearward position. The movable plate 47 is formed with a bevelled cam edge 49, against which the pin 45 on the operating lever 43 is adapted to bear while the movable plate 48 is formed with a bevelled cam edge 50 against which the pin 46 on the operating lever 44 is adapted to bear. The both cam edges 49, 50 are of an identical configuration and have the same orientation. It should be understood that a plurality of such cam edges are provided which correspond to the number of pushbutton actuators. Pins 51, 52 are fixedly mounted on the right-hand end, as viewed in FIG. 1, of the movable plates 47, 48, and a link bar 53 has its opposite ends pivotally mounted on these pins. A pivot pin 56 which is secured to the baseplate 11 at its one end is fitted in the central portion of the link bar 53 to permit it to rock about the pin 56. As indicated in FIG. 2, the movable plates 47, 48 are connected together by a similar link bar 53 at their other end. These link bars 53 permit the pair of movable plates 47, 48 to be maintained in parallel relationship always while allowing them to move in opposite directions. While not shown, a variable tuning element is connected to either end of the movable plates 47, 48 in a manner well known in the art. The adjustment of the variable tuning element in accordance with the lateral movement of the movable plates to establish a predetermined tuning frequency which corresponds to the position of the movable plates is well known in the art of pushbutton tuners, and is disclosed in detail in the cited U.S. Pat. No. 4,099,421, for example, and hence will not be described herein. This patent discloses a mechanism which is used to adjust the movable plates and the variable tuning element to a position corresponding to a desired frequency to be received, by tuning a manual rotary knob through a clutch assembly. Such mechanism is directly applicable in the present embodiment. The clutch assembly is provided in order to permit a movement of the movable plates and the variable tuning element whenever the manual knob is turned while preventing the knob from rotating in response to an operation of either pushbutton.

Figure 3:
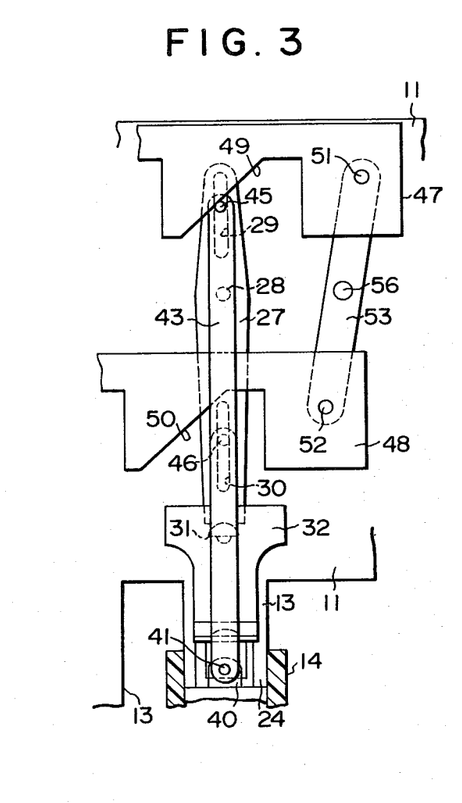
FIGS. 3 and 4 are plan views illustrating the operation of the pushbutton tuner shown in FIG. 1.

In operation, the pushbutton actuator 12 is preset for tuning to a particular frequency. At this end, the control plate 27 is positioned relative to the corresponding bevelled cam edges 49, 50. The positioning operation is initiated by drawing the pushbutton 14 forwardly from its inoperative position, as shown in FIG. 1. When the pushbutton 14 is moved forwardly, the engaging pin 35 bears against the front end of the slot 33 formed in the preset plate 23, causing the latter to move also forwardly. In this manner, the wedge portion 22 is released from the locking lever 32, thus unlocking the control plate 21. Then a rotary knob is turned to adjust the variable tuning element so as to be tuned to a desired frequency. The movement of the variable tuning element is transmitted to the movable plates 47, 48, causing them to move in a corresponding manner. Assume now that the variable tuning element is connected to the movable plate 47 and hence that as the variable tuning element is adjusted, the movable plate 47 moves to the right, as viewed in FIG. 1. Such movement is transmitted through the link bar 56 to drive the movable plate 48 to the left, whereby the movable plates 47, 48 will be located as shown in FIG. 3. The pushbutton 14 is then pushed in rearwardly, whereby the sliding plate 36 moves rearwardly. The first and the second operating lever 43, 44 having their one end mounted on the sliding plate 36 will move rearwardly, with the pins 45, 46 provided on their other end being guided by the slots 29, 30 formed in the control plate 27. As a result of such movement, the pin 45 on the first operating lever 43 initially bears against the cam edge 49 formed in the movable plate 47, as shown in FIG. 3. As the pushbutton is pushed further inward, the pin 45 tends to move upward along the cam edge 49, with result that the first operating lever 43 and the control plate 47 rotate clockwise. The rotation of the control plate 27 causes the second operating lever 44 to rotate counterclockwise about the pivot pin 41, and hence the pin 46 which has been free is brought into abutment against the cam edge 50 in the movable plate 48 (see FIG. 4). This ceases the clockwise rotation of the control plate 27. When the both pins 45, 46 bear against the cam edges 49, 50, component forces $V_b$ are developed which tend the movable plates 47, 48 to move in the same direction in response to the force $V_a$ which acts in a direction parallel to the direction of movement of the pushbutton 14. However, since the pair of movable plates 47, 48 are connected together by the link bar 53 as mentioned previously, the movement of the both movable plates 47, 48 in the same direction is prevented, whereby they are locked relative to each other. The combination of the engaging pin 35 and the slot 34 formed in the baseplate 11 permits the pushbutton 14 to be pushed in further rearward. Such movement of the pushbutton 14 is effective to bring the engaging pin 35 into abutment against the rear end of the slot 33 formed in the preset plate 23, causing the latter to move rearwardly, with the wedge portion 22 inserted underneath the upwardly curved front end of the plate locking lever 32. Thereupon, the rear end of the locking lever 32 firmly clamps the front end of the control plate 27. In this manner, the control plate 27 is locked in position shown in FIG. 4. On the other hand, the inclined step 39 of the pushbutton 14 engages the front end of the folded piece 38 extending from the sliding plate 36, and the sliding plate 36 which has been moving with the pushbutton 14 is prevented from further movement by the abutment of the pins 45, 46 on the first and the second operating lever 43, 44 against the cam edges 49, 50, respectively. However, the provision of the elongate slot in the sliding plate 36 enables the pushbutton 14 alone to be moved rearwardly in order to lock the control plate 27 in the manner mentioned above. As a result of such movement of the pushbutton 14, the folded piece 38 rides up the inclined step 39, whereby the sliding plate 36 is fixed to the pushbutton 14. When the pushbutton 14 is released, the spring 26 returns it forwardly together with the first and the second operating lever 43, 44. The returning movement is interrupted when the engaging pin 35 engages the front end of the slots 33 formed in the preset plate 23 (FIG. 5). In order to insert the preset plate 23 between the baseplate 11 and the plate locking lever 32 and to cause the folded piece 38 to ride up the inclined step 39, a force of a magnitude which is greater than that required during a normal pushbutton operation is necessary. It may appear that the force of such an increased magnitude may cause a displacement of the movable plates 47, 48. However, since the plates 47, 48 are locked relative to each other in the manner mentioned above, the application of such an increased force cannot cause a displacement of the plates, and the component forces $V_b$ are effective to eliminate any rattling in the pivotal connection between the plates and the link bar 53 as well as between the slots 29, 30 and the pins 45, 46.

Figure 4:
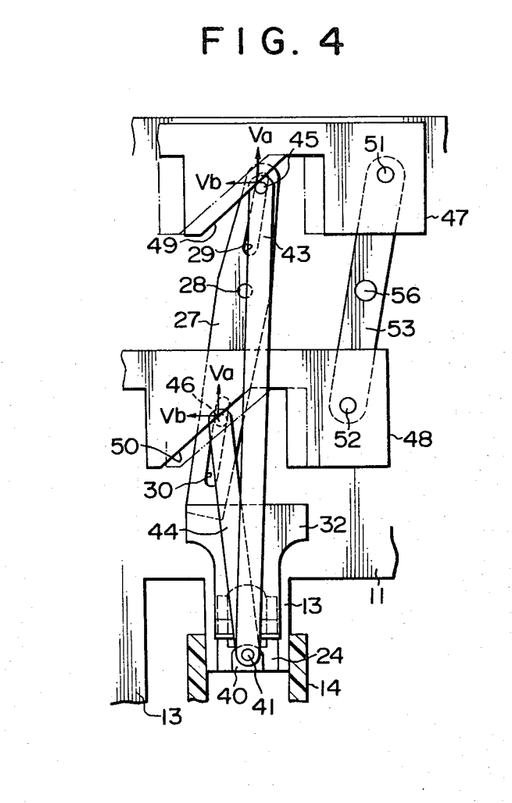
Figures 5, 6:
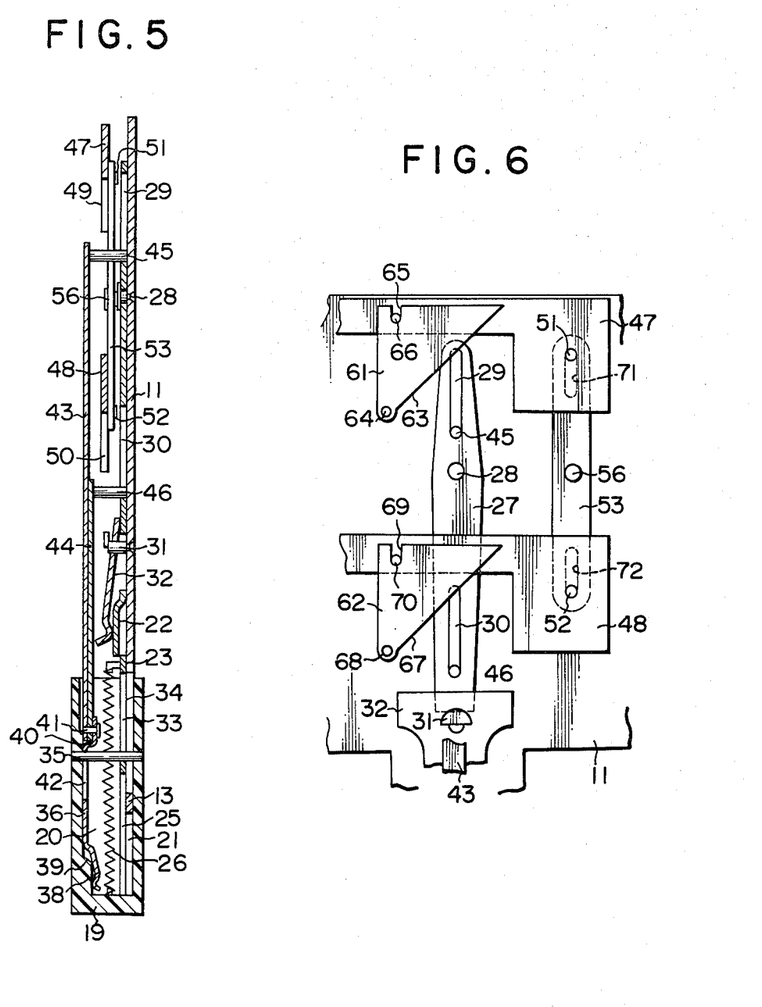
FIG. 5 is a longitudinal section illustrating the pushbutton tuner of FIG. 1 when its presetting operation has been completed, the section being taken along the line 2—2 shown in FIG. 1 in the similar manner as in FIG. 2.
FIGS. 6, 7 and 8 are plan views of essential parts of pushbutton tuners according to other embodiments of the invention.

Referring to FIG. 4, a normal channel selection after the respective pushbutton actuators have been preset to desired frequencies in the manner mentioned above will now be described. It is assumed that the movable plates 47, 48 assume respective positions indicated in phantom lines as a result of operating other buttons. When the pushbutton 19 is pushed from its inoperative position, which is constrained by the slot 33 in the preset plate 23, to its operative position, only the first and the second operating lever 43, 44 will move rearwardly with the pins 45, 46 being guided by the elongate slots 29, 30 formed in the control plate 27. The pin 46 initially engages the cam edge 50 formed in the movable plate 48, causing it to move to the left, as viewed in FIG. 4. This movement is transmitted through the link bar 53 to cause the movable plate 47 to move to the right, whereby the latter moves to the right from its position shown in phantom lines. Such movement of the movable plate 47 brings the cam edge 49 into abutment against the pin 45, whereupon a further movement of the movable plate 47 is blocked. This also blocks a movement of the movable plate 48, preventing a further rearward movement of the first and the second operating lever 43, 44. The positions of the movable plates 47, 48 which they assume when a further rearward movement is blocked in this manner represent their positions which correspond to the frequency which has been established for the particular pushbutton actuator. When the pins 45, 46 both bear against the cam edges 49, 50 formed in the movable plates 47, 48 to achieve a channel selection, component forces $V_b$ are developed at the respective points of engagement in response to the force $V_a$ applied to the pushbutton 19. As mentioned above, these component forces will be developed in the same direction to remove any rattling in the pivotal connection between the movable plates 47, 48 and the link bar 53 and between the slots 29, 30 and the pins 45, 46.

In the present embodiment, when the pins 45, 46 bear against the cam edges 49, 50, respectively, the distances $L_a$, $L_b$ between the respective points of abutment and the pivot pin 28 are chosen to be substantially equal to each other, so that the stroke through which the pushbutton 14 is pushed from its inoperative position to its operation position can be made uniform irrespective of the angular orientation of the control plates 27.

FIG. 6 shows a second embodiment of the invention in which a pair of cam members 61, 62 are used to move the movable plates 47, 48 in accordance with a movement of the first and the second operating lever 43, 44. In this embodiment and other embodiments to be described later, only essential parts are shown and described. The remainder can be the same as the corresponding arrangement shown in the first embodiment, and therefore will not be shown nor described. The cam member 61 is provided with a rectilinear cam edge 63 which is engaged by the pin 45 on the first operating lever 43 when the pushbutton 19 is pushed rearwardly. It is pivotally mounted on a pivot pin 64 secured to the baseplate 11 intermediate the movable plates 47, 48. The cam member 61 includes a side which is located above the movable plate 47 and which is formed with a notch 65 extending in a direction parallel to the direction of movement of the pushbutton 14. A pin 66 fixedly mounted on the movable plate 47 is loosely fitted in the notch 65. Similarly, the cam member 62 is provided with a rectilinear cam edge 67 which is engaged by the pin 46 on the second operating lever 44, and is pivotally mounted on a pivot pin 68 secured to the baseplate 11 intermediate the movable plate 48 and the plate locking lever 32. The cam member 62 includes a side which is located above the movable plate 68 and which is formed with a notch 69 extending in the same direction as the notch 65. A pin 70 fixedly mounted on the movable plate 48 is loosely fitted in the notch 69. Thus, in the second embodiment, when either one of the pins 45, 46 bear against the corresponding cam edge 63 or 67, a force is applied to either one of the cam members 61, 62 which causes it to rotate, thus moving a corresponding one of the movable plates 47, 48. This facilitates a movement of the movable plates 47, 48, permitting the force applied to the pushbutton 19 to be reduced. In this embodiment, the movable plates 47, 48 are connected together by a link bar 53 which interconnect the right-hand ends thereof, as viewed in FIG. 6, and while their left-hand ends are not shown, they are displaceably supported by upstanding portion formed on the baseplate 11. The link bar 53 is formed with lengthwise elongate slots 71, 72, in which pivot pins 51, 52 are loosely fitted to permit a parallel movement of the movable plates.

Figure 7:
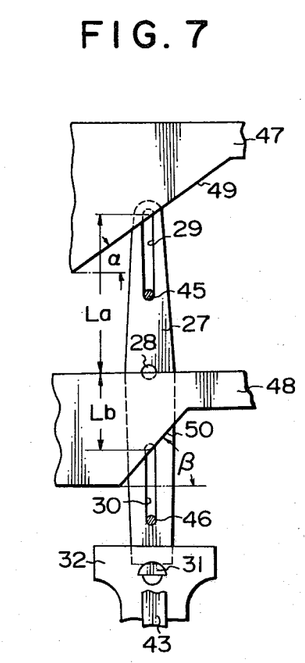

FIG. 7 shows a further embodiment of the invention in which the stroke through which the pushbutton 14 is pushed can be made substantially uniform irrespective of the angular orientation of the control plates 27. In this third embodiment, the pivot pin 28 of the control plate 27 is located so that the distances $L_a$, $L_b$ between the pivot pin 28 on one hand and the respective points of abutment, on the other, of the pins 45, 46 against the cam edges 49, 50 are different from each other. In the example shown, the cam edge 49 of the movable plate 47 which is associated with a longer distance $L_a$ has an angle of inclination $\alpha$ which is less than the angle of inclination $\beta$ of the cam edge 50 of the movable plate 48 associated with a shorter distance $L_b$, thereby permitting the stroke through which the pushbutton 14 is pushed to be substantially uniform irrespective of the angular orientation of the control plates 27.

Figure 8:
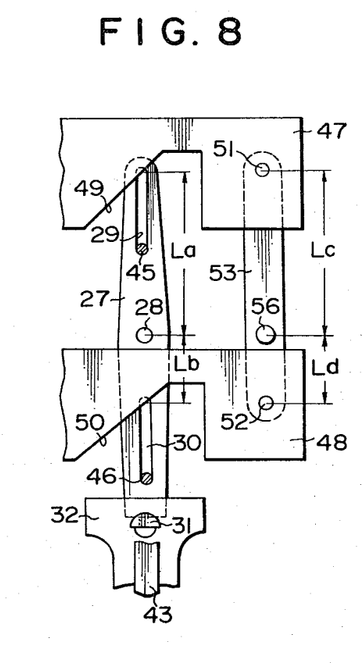

While not shown, in this embodiment, the pair of movable plates 47, 48 are connected together by the link bar 53 which is pivotally mounted intermediate its length as in the first embodiment. However, as shown in FIG. 8, the location of the pivot for the link bar 53 may be displaced in accordance with a change in the distances $L_a$, $L_b$, thereby achieving a substantially uniform stroke for the pushbuttons. Specifically, the pivot pin 28 of the control plate 27 is located so that the distances $L_a$, $L_b$ between the pivot pin 28 on one hand and the respective points of abutment, on the other, of the pins 45, 46 against the cam edges 49, 50, respectively, are difference from each other, as mentioned above in connection with the third embodiment. Representing the distance between the pivot pin 56 of the link bar 53 and the pivot pin 51 by $L_c$ and the distance between the pivot pin 56 and the pivot pin 52 by $L_d$, an arrangement may be chosen such that $L_b/L_a = L_d/L_c$. This permits a travel of the movable plate 47 to be made greater than that of the movable plate 48, so that the angle of inclination for the cam edges 49, 50 may be equal to each other.

As discussed above, the stroke through which the pushbuttons are pushed may be made substantially uniform irrespective of the angular orientation of the control plates 27 by changing the angle of inclination of the cam edges 49, 50 or displacing the pivot of the link bar 53 as illustrated in the third and the fourth embodiment where the overall configuration of the pushbutton tuner prevent the distances $L_a$, $L_b$ from being made equal to each other.

What is claimed is:

1. A pushbutton tuner including a support, tuning means mounted on the support so as to be movable to a position which corresponds to a tuning frequency to be established, and a plurality of presettable pushbutton actuators for selectively adjusting the tuning means to individual positions, each of the pushbutton actuators including a pushbutton which is movable between a front inoperative and a rear operative position relative to the support and which is normally urged to its inoperative position, a control member pivotally mounted on the support and having lengthwise elongate slots formed in its opposite ends, the control member assuming a position relative to the support which can be adjusted, a preset member for releasably locking the control member on the support, a first operating lever having its one end pivotally mounted on the pushbutton and carrying a pin on its other end which is fitted into one of the slots in the control member, and a second operating lever having its one end pivotally mounted on the pushbutton and carrying a pin on its other end which is fitted in the other slot formed in the control member, the tuning means including a pair of movable members extending in a direction perpendicular to the direction of movement of the pushbutton, a link member having its opposite ends connected to the movable members so that a movement of one of the movable members in one direction causes a movement of the other movable member in the opposite direction, and means operative when the pushbutton is moved to its operative position to transmit a movement of the first or the second operating lever to one of the movable members to thereby cause that movable member to move in one direction, the movement of said one movable member in said one direction being terminated when the resulting movement of the other movable member in the opposite direction is constrained by the associated pin.

2. A pushbutton tuner according to claim 1 in which the pushbutton has a hollow interior which is open at its rear end, an extension from the front end of the support being slidably received in the hollow pushbutton, said one end of the first and the second operating lever being pivotally mounted in the hollow interior of the pushbutton, at least part of the preset member being slidably received within the hollow pushbutton.

3. A pushbutton tuner according to claim 1 in which the transmitting means comprises cam edges formed on the pair of movable members and having an equal angular orientation, said one movable member moving in one direction upon abutment of one of the pins against the cam edge of said one movable member as it moves through the elongate slot formed in the control member, the movement of said one movable member being transmitted through the link member to cause the other movable member to move in the opposite direction until the other pin abuts against the other cam edge, whereupon a further movement of said other movable member is interrupted.

4. A pushbutton tuner according to claim 1 in which the transmitting means comprises a first and a second cam member, each cam member having its one end pivotally mounted on the support, the other end of the first cam member being connected to said one movable member, the other end of the second cam member being connected to the other movable member, the first and the second cam member each having a cam edge which has an equal angular orientation, one of the pins bearing against one of the cam edges to cause the corresponding cam member to rotate in one direction as it moves through the elongate slot formed in the control member, the rotation of said one cam member causing one of the movable members to move in one direction which in turn causes the other movable member to move in the opposite direction from that of said one movable member, a further movement of said other movable member being interrupted as the other cam edge bears against the other pin to block a rotation of the other cam member.

5. A pushbutton tuner according to claim 2 in which the preset member is formed with an elongate slot which extends in a direction parallel to the direction of movement of the pushbutton, the length of the slot being equal to the distance between the inoperative and the operative position of the pushbutton, an engaging pin which has at least its one end fixedly mounted in the pushbutton and extending in a direction perpendicular to the surface of the preset member being loosely fitted in the elongate slot.

6. A pushbutton tuner according to claim 3 or 4 in which when the pair of pins abut against the respective cam edges, the distances between the pivot of the control member and the respective points of abutment are different from each other, one of the cam edges engaged by one of the pins which has a greater value of the distance having an angle of inclination which is less than the angle of inclination of the other cam edge.

7. A pushbutton tuner according to claim 3 or 4 in which the pivot of the control member is located such that the distances between the pivot and the respective points of abutment between the pair of pins against the corresponding cam edges is equal to each other.

8. A pushbutton tuner according to claim 3 or 4 in which the pivot of the control member is located such that the distances between the pivot of the control member and the respective points of abutment of the pairs of pins against the corresponding cam edges are different from each other, the link member being pivotally mounted on the support in a manner such that the location of the connection with the pair of movable members and of the pivot thereof depend on the ratio of the different distances.

* * * * *